United States Patent [19]

Henry

[11] 4,035,576

[45] July 12, 1977

[54] ELECTRICAL CIRCUIT PANEL WITH CONDUCTIVE BRIDGE PLATE OVER A NON-SOLDERABLE SURFACE AREA

[75] Inventor: Jean Henry, Wezembeek-Oppem, Belgium

[73] Assignee: Splintex Belge, Brussels, Belgium

[21] Appl. No.: 565,700

[22] Filed: Apr. 7, 1975

[30] Foreign Application Priority Data

Apr. 26, 1974 Luxembourg .................. 69945

[51] Int. Cl.² .................................. H05K 1/00
[52] U.S. Cl. .................. 174/68.5; 219/543; 338/307; 361/397
[58] Field of Search .......... 174/68.5; 338/307, 308, 338/314, 316, 329; 343/711, 712, 873; 219/543; 317/101 CC, 101 B

[56] References Cited

U.S. PATENT DOCUMENTS

| 2,066,511 | 1/1937 | Arlt ................................ 174/68.5 |
| 2,715,668 | 8/1955 | Booker et al. ................. 219/543 X |
| 2,772,501 | 12/1956 | Malcolm ......................... 174/68.5 |
| 3,355,545 | 11/1967 | Kilduff et al. ............. 174/68.5 UX |
| 3,406,246 | 10/1968 | Davidson et al. ............. 174/68.5 |
| 3,634,654 | 1/1972 | Peetz et al. ................ 219/543 X |
| 3,705,047 | 12/1972 | Marriott .................... 219/543 UX |
| 3,762,040 | 10/1973 | Burns et al. ................... 174/68.5 |
| 3,813,519 | 5/1974 | Jochim .......................... 219/543 |
| 3,846,743 | 11/1974 | Garver ....................... 174/68.5 X |

FOREIGN PATENT DOCUMENTS

| 1,245,972 | 2/1971 | United Kingdom ............. 174/68.5 |

*Primary Examiner*—Arthur T. Grimley
*Attorney, Agent, or Firm*—Cushman, Darby & Cushman

[57] ABSTRACT

An electrical circuit panel having provisions for mitigating joint failure of soldered connections thereof. An electrical conductor is formed by an electrically conductive coating(s) on a support. The conductor has a discontinuity formed therein which exposes a portion of the support or an underlying second conductor that is non-solderable. An electrically conductive bridge plate is soldered into electrically conductive engagement with the conductor at two distinct spaced positions along the plate, the two positions being located on opposite sides of the discontinuity. The bridge plate may be arched between the two positions if desired, and the panel as a whole may comprise an electrical resistance heating panel.

14 Claims, 8 Drawing Figures

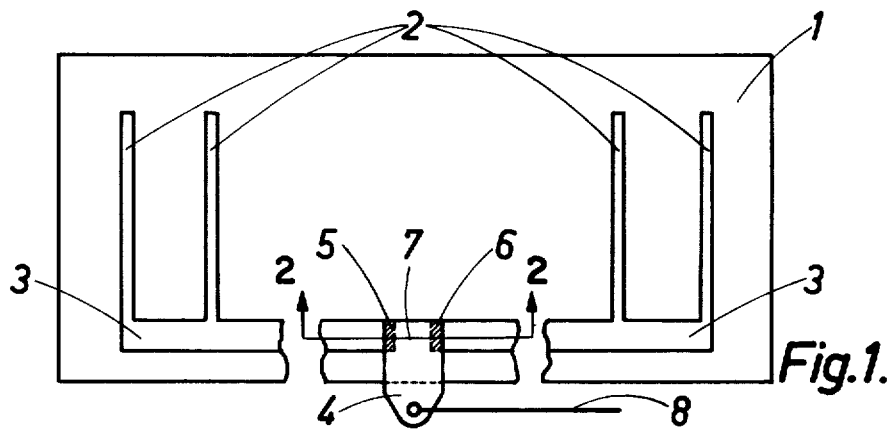
Fig.1.
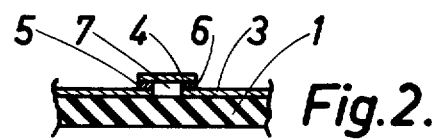
Fig.2.
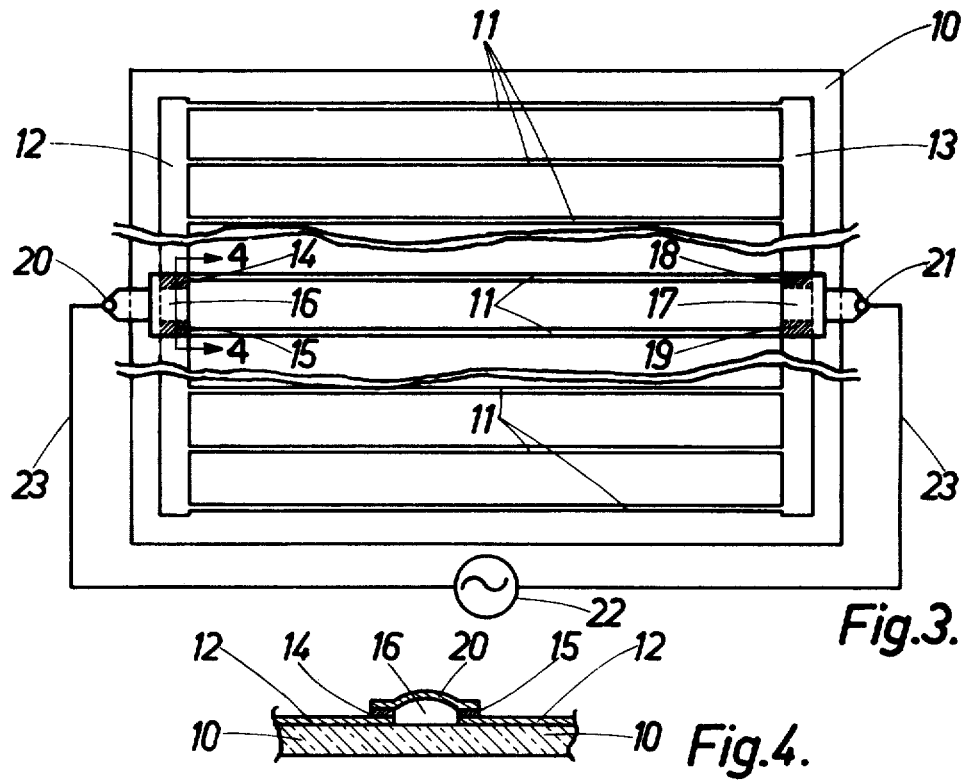
Fig.3.
Fig.4.

ELECTRICAL CIRCUIT PANEL WITH CONDUCTIVE BRIDGE PLATE OVER A NON-SOLDERABLE SURFACE AREA

BACKGROUND AND SUMMARY OF THE INVENTION

This invention relates to an electrical circuit panel comprising an electrical conductor formed by an electrically conductive coating or coatings on a support, and a lead-in wire connector soldered to the conductor.

Electrical circuits formed on such circuit panels can be of diverse natures and can fulfill different functions. In particular, and by way of example, they can be resistors, inductors, capacitors, antennae, heating panels, or electrooptical panels, or they may comprise a combination of these elements. Alternatively, such a circuit may comprise elements which simultaneously fulfill more than one of these functions.

Such circuits are normally intended to form part of a more complex circuit comprising other elements or electrical apparatus, and to this end the circuit panel is provided with connection means.

A lead-in wire connector is soldered to said conductor in order to ensure maximum conductivity at the joint. Such a connector is usually of a metal, and is often of a different composition from the material to which it is fixed. Under certain conditions, therefore, for example, due to differential thermal expansion or contraction, stresses can build up in the joint, and the joint can deteriorate and even rupture. This necessitates the formation of a new solder joint, which may require removal of the panel since it will not always be possible to re-solder the joint in situ. Under some circumstances an even worse problem may arise in that the conductive coating at the joint may be torn away from the support, and in such cases it is usually necessary to replace the whole panel.

It is an object of the present invention to mitigate this disadvantage.

According to this invention, an electrical circuit panel comprises an electrical conductor formed by an electrically conductive coating or coatings on a support, and a lead-in wire connector soldered to the conductor, and is characterised in that in said conductor there is a discontinuity which exposes an underlying non-solderable surface area, and said connector is in the form of an electrically conductive bridge plate which is soldered to such conductor at two positions spaced apart along such plate on opposite sides of said discontinuity.

Normally, when making a solder joint, the solder will tend to flow along from the positions at which it is applied, and the said discontinuity in the conductor which exposes a non-solderable surface area ensures that even if the solder from such positions should spread across, there will be an area between the said positions where it will not form a bond. Said exposed non-solderable surface area may be an area of the surface of the support, or an area of the surface of a coating applied to the support beneath said conductor.

The present invention also achieves a further advantage, in that by soldering the connector to the conductor at two spaced positions in this way, any internal stresses which build up on the joint will be distributed between the two positions at which solder is applied and the interior of the bridge plate. Because of this, a said joint in a panel according to the invention gives a better resistance to stresses therein whether they arise through differential thermal expansion or externally, for example due to shocks on the panel as a whole or tension, flexure or twisting of the connector itself.

The attachment of a said connector to a said conductor is simplified by making the connector in the form of a plate.

The said conductor(s) of the panel can be formed in different ways and have different structures. For example, an electrically conductive coating constituting a said conductor can be printed onto the support. Such a coating may for example comprise a conductive line or ribbon or a network of such lines or ribbons, or it may comprise a coating layer which might for example be spread substantially uniformly over the greater part or even the whole of the support. By way of example, a conductive coating may be formed by applying to one of the faces of the support by a silk-screen process, an enamel precursor comprising a suspension of metallic particles such as silver and particles of a low melting point glass in an organic binder, and then heating to drive off the organic binder and fuse the enamel. Alternatively, a said conductive coating may be formed by a chemical process, by vacuum evaporation or by pyrolysis.

The conductor deposited on the support can for example be constituted by a single coating or by several superposed continuous coatings of which one or more is a metal or a conductive metal compound.

The support itself can be formed from a body, for example a plate or sheet, of a vitreous material such as glass or a vitro-ceramic, or of a ceramic, or of other suitable insulating material.

The connector is suitably of a highly conductive metal, such as copper or brass.

Preferably, the connector is shaped to provide a laterally extending tongue between said two positions, since this simplifies the attachment of a lead-in wire after the connector has been soldered to a said conductor. The connector may for example be in the form of a T-shaped plate, the two ends of the horizontal portion of the T being soldered to the conductor, and the vertical portion serving as an attachment of a lead-in wire. Such vertical portion of the T may be bent up away from the plane of that portion of the support over which it is soldered if this is desired so as further to simplify the attachment of a lead-in wire.

The connector may, for example, be flat or arched. Embodiments of the invention wherein the connector is flat have the advantage that the connector is less liable to be subjected to knocks, and, if the connector is at an edge of the panel, framing is simplified. Embodiments of the invention wherein the connector is arched between said two positions have the advantage that, because the height of the center of the arch above the underlying surface is greater than that of the ends of the arch, the tendency of solder applied at said two positions to flow along under the bridge plate is reduced; also, the connector itself can flex more easily under the influence of differential thermal expansion of the connector and the support, thus reducing strain on the joints.

Preferably, the discontinuity in the conductor is at least 6mm long measured in the direction between said two positions. This also tends to limit solder flow beneath the connector plate. It is preferred that the non-solderable surface area beneath the plate should extend across the whole width thereof, thus completely separating the two soldering positions. Of course, any solderable area beneath the plate should be small enough and/or sufficiently well spaced from the two soldering positions as to inhibit the flow of solder therealong. It is especialy suitable to form the conductor to which the connector is soldered as a strip which is interrupted along its length. Such interruption then constitutes the discontinuity which exposes said underlying non-solderable surface area. The portions of such a conductor strip on opposite sides of the interruption may be formed simultaneously or successively. In some cases it may be desired to cause different currents to flow in such different conductor portions, and this can readily be done either by altering the cross-sectional area of one strip portion with respect to the other, or by forming the two strip portions of different materials.

Preferably, the conductor to which the connector is soldered is in circuit with at least one other conductor of higher resistance. In this way, the feeding of current to or from the circuit carried by the electrical circuit panel is made more effective. Electrical circuit panels according to the present invention in which this feature is adopted are especially suitable for use as resistance heating panels.

In one preferred form of electrical resistance heating panel according to the invention, there are two said conductors to which lead-in wire connectors are soldered, and said conductors are interconnected by a plurality of electrically conductive coating strips of higher resistance than said two conductors. This is a very convenient way of ensuring that that portion of the support which carries conductive material is substantially uniformly heated. Such higher resistance coating strips may be of the same material as said two conductors, and may be applied to the support by or in the same process. For example, higher resistance coating strips and said conductors may be of a conductive enamel and applied simultaneously be a silk-screen process. In order to achieve their higher resistance in such a case, those coating strips would of course have to have a smaller cross-sectional area than said conductors.

In another preferred form of electrical resistance heating panel according to this invention, there are two said conductors to which lead-in wire connectors are soldered, and such conductors are deposited on top of another conductor of higher resistance which is constituted as a substantially uniform electrically conductive coating layer. Such a coating layer may for example be formed by electro-deposition or pyrolysis and extend over substantially the whole of one surface of the support. One of the differences between these two types of heating panels is a matter of aesthetics. For example, in the case where such panels are transparent and utilized as heatable rear windows of motor vehicles, for which use they are especially suitable, one user may prefer to suffer the slight loss of overall transparency given by a uniform coating layer rather than have the window crossed by a series of coating strips, whilst another user may prefer high transparency over the greater part of the window and accept the presence of the coating strips. However, in the case of heatable vehicle windscreens where such coating strips might prove visually distracting, it is preferable to have a uniform transparent coating layer.

Preferably, the maximum height of a said connector above the support is less then 3mm. This reduces the likelihood of the connector being jolted or otherwise subjected to mechanical shocks, and where such connector is located at the edge of the panel, it simplifies framing thereof should that be required.

BRIEF DESCRIPTION OF THE DRAWINGS

Various preferred embodiments of electrical circuit panel according to the present invention will now be described by way of example with reference to the accompanying diagrammatic drawings, in which:

FIG. 1 is a plan view of an exemplary panel according to the present invention comprising a radio antenna;

FIG. 2 is a cross-sectional view of a portion of FIG. 1 taken along lines 2—2 of FIG. 1;

FIG. 3 is a plan view of an exemplary first heating panel according to the present invention;

FIG. 4 is a cross-sectional view of a portion of FIG. 3 taken along lines 4—4 thereof;

Figure 5:
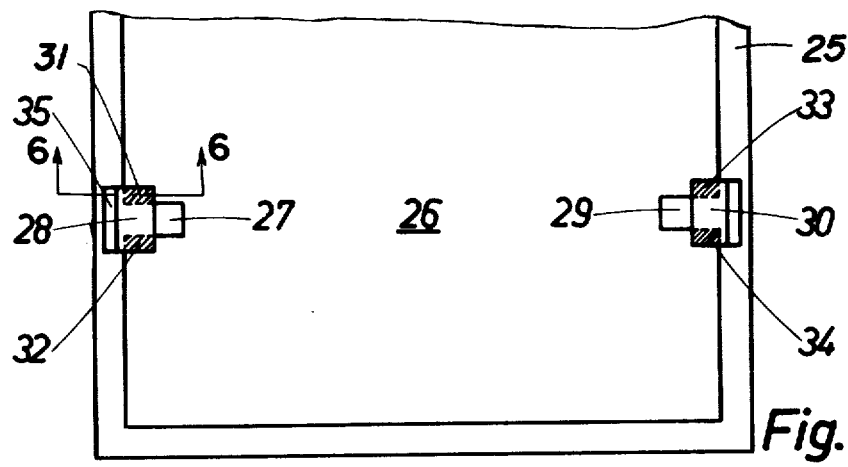
FIG. 5 is a plan view of a second exemplary heating panel.

It is emphasized that the accompanying drawings are not to scale.

DETAILED DESCRIPTION OF THE INVENTION

EXAMPLE 1

FIG. 1 is a plan view of a support 1 carrying a radio antenna comprising a plurality of fine electrically conductive coating strips 2, each of which is joined at one end to a collector strip 3 which constitutes a discontinuous electrically conductive coating strip.

A connector 4 in the form of an electrically conductive bridge plate is soldered to the collector strip 3 in facing relationship to the support 1 at two positions 5, 6 spaced apart along such connector 4 on opposite sides of an interruption 7 in the collector strip 3. This interruption 7 which constitutes a discontinuity in the electrically conductive coating strip 3 is clearly shown in FIG. 2, and exposes an area of the support 1 lying beneath the connector 4, which area in non-solderable. A lead-in wire 8 is soldered to the connector 4.

The electrically conductive coating strips 2 and 3 may, for example, be of copper deposited onto the support 1, and the connector 4 may likewise be of copper to facilitate the formation of secure solder joints at the two positions 5 and 6 which are shown as hatched areas in FIG. 1.

When solder is melted between two surfaces which are close together, and assuming that the molten solder wets those surfaces (which is necessary for a secure joint), the solder will flow under surface tension effects and tend to fill the gap between those surfaces. If, however, a portion of one of those surfaces is not wettable by molten solder, that is, is non-solderable, there will be little or no such tendency unless there is an excess of solder present. Even if such an excess of solder is present, there will be no bond formed over the non-wettable (and thus nonsolderable) surface portion when the solder solidifies.

Thus, in the present Example, even if an excess of solder is applied between the connector 4 and the collector strip 3 on the support 1 so that it flows to form a continuous body between the two spaced positions 5 and 6, the connector 4 will not be bonded to the non-solderable surface area of the support 1 which is exposed by the interruption 7 in the strip 3. The connector 44 will therefore be solder-bonded only at the two spaced positions 5 and 6, so that any stresses due, for example, to differential thermal expansion of the connector 4 and support 1, will be distributed between the connector and its joints at those two positions rather than confined to a joint alone.

In a particular practical embodiment, the strip 3 6mm wide and the interruption 7 was 10mm long in the direction measured between the two positions 5 and 6 at which solder was applied to form a joint. The maximum height of the connector above the support was 1mm.

EXAMPLE 2

FIG. 3 shows a transparent heating panel comprising a glass support 10 to which have been applied a plurality of electrically conductive lines 11 arranged in parallel and extending between a pair of electrically conductive coating strips 12, 13. The electrically conductive lines and strips 11, 12, 13 are constituted by an enamel which contains silver particles, and are formed simultaneously, by applying to the support by a silk-screen process, an enamel precursor comprising a suspension of silver particles and particles of a low melting point glass in an organic binder, and then heating the support to drive off the binder and vitrify the enamel. The lines 11 are of smaller cross section than the strips 12, 13 and are thus of higher resistance, and constitute the heating elements proper of the panel. The strips 12, 13 are arranged as collector strips for delivering current to these heating elements.

Each collector strip 12, 13 is interrupted along its length between two positions to expose a non-solderable surface area over a region beneath a connector to be soldered at such positions. Thus a first collector strip 12 has two solder positions 14, 15 on either side of a region 16 where a non-solderable surface area of the support 10 is exposed, and the second collector strip 13 is interrupted at a region 17 between two solder positions 18, 19. Connectors 20, 21 are respectively soldered to the collectors 12, 13 and are connected to a source of electrical power 22 by lead-in wires 23.

The connectors 20, 21 are suitably of silvered copper and are each shaped to provide a tongue which extends laterally from between the two positions at which the respective connector is soldered to a collector strip to facilitate attachment of the lead-in wires 23. FIG. 4 is a detail view of the panel of FIG. 3 and shows the connector 20 which is soldered to the first collector strip 12. From inspection of FIG. 4, it will be noted that the connector 20 is arched between the two positions 14, 15 at which it is soldered to the collector strip 12. The other connector 21 is similarly arched.

Soldering of the connectors 20, 21 to the collector strips respectively 12, 13 can be performed in known manner using a low melting point alloy, and is preferably done so that there is a complete absence of solder in the regions 16 and 17. However, if the joints are badly made or if there is an excess of solder applied, the exposure of non-solderable surface areas of the glass support 10 in the regions 16, 17 ensures that even if solder is present in those regions no direct solder bond will be formed there between a connector and the support.

Arching of the connectors 20, 21 as described above with reference to FIG. 4 has the effect, even when an excess of solder is applied to a connector-to-collector strip joint, of inhibiting flow of molten solder, for example due to surface tension effects, across the regions 16, 17 where non-solderable surface areas are exposed.

The heating panel shown in FIG. 3 will, of course, be subject to thermal expansion and contraction during its working life, and this will give rise to stresses at the joints between the connectors and their respective collector strips. Because each connector is soldered to a collector strip at two distinct spaced positions, such stresses can be easily withstood. Arching of the connectors as shown in FIG. 4 is also of assistance in this respect.

In a particular practical embodiment, the interruptions in the two collector strips 12 and 13 were each 14mm long in the direction measured between the solder positions on each such strip, and these positions themselves each occupied an area 8mm long measured in the same direction.

An appropriately shaped panel of the type shown in FIGS. 3 and 4 is especially suitable for use as an electrically heatable vehicle rear window.

EXAMPLE 3

FIG. 5 is a plan view of another form of heating panel which comprises a ceramic support 25 which carries a conductive coating 26 extending over the greater part of one of its faces. Such coating may for example be a metallic layer deposited by vacuum evaporation or pyrolysis. There is a first discontinuity 27 in the coating 26 beneath a first connector 28, and a second discontinuity 29 beneath a second connector 30. The first connector 28 is soldered to the conductive coating 26 at two positions 31, 32 spaced apart on opposite sides of the first discontinuity 27 which may for example measure 10mm in the direction between such two positions. The second connector is also soldered to the coating, at two positions 33, 34 on opposite sides of the second discontinuity 29. Each such discontinuity exposes a non-solderable surface beneath its respective connector which area separates the two associated positions at which solder is applied.

Figure 6:
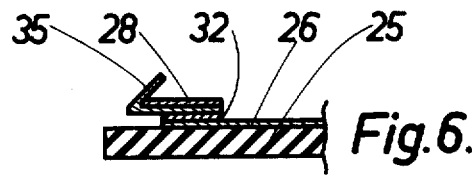
FIG. 6 is a cross-sectional view of a portion of FIG. 5 taken along lines 6—6 thereof.

As will be more clearly seen from FIG. 6 which is a detail view partly in cross section in the direction of the arrows in FIG. 5 and which shows the first connector 28, that connector is provided with a flange 35 bent up at one edge thereof to facilitate the attachment of a leadin wire (not shown). The remainder of the connector 28 is arched in the same manner as the connector 20 shown in FIGS. 3 and 4. The second connector 30 of the panel shown in FIG. 5 is of the same shape as the first connector 28.

In a particular practical embodiment, the tops of the arches of the connectors 28 and 30 were 2.5mm above the surface of the support 25, and the flanges of the connectors were 3.5mm above such support.

EXAMPLE 4

Figure 7:
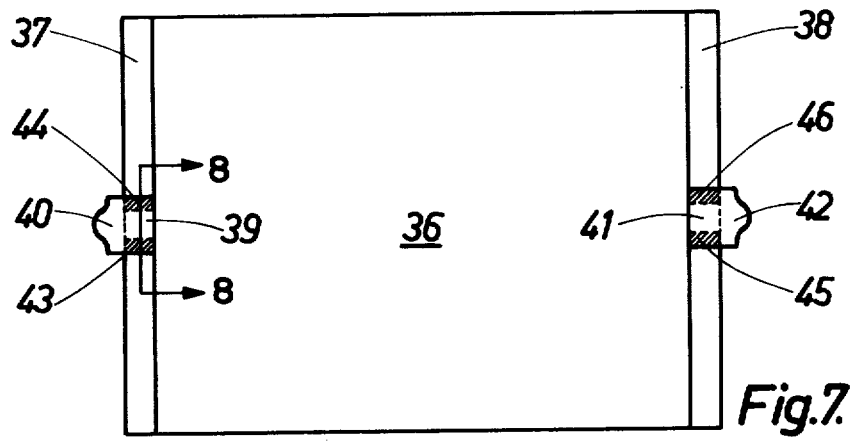
FIG. 7 is a plan view of a third exemplary heating panel.

FIG. 7 shows a glazing panel having a thin, transparent, electrically conductive coating 36 comprising tin oxide ($SnO_2$) which was deposited by pyrolysis. Two conductive enamel strips 37, 38 each 8mm wide are formed along opposed margins of the panel, these strips being interrupted respectively at regions 39 and 41, so as to expose, in these regions, portions of the tin oxide coating 36, which is nonsolderable.

Two connectors 40, 42 for the attachment of leadin wires (now shown) are soldered one to each of the enamel strips 37, 38 bridging the interruption 39, 41 therein, at positions 43, 44 and 45, 46 respectively. The two positions of each pair 43, 44 and 45, 46 of positions at which solder is applied lie on opposite sides of the interruption 39 or 41 in the respective enamel strip 37 or 38, and each such interruption is suitably 12mm long in the direction measured between the two position of the respective pair 43, 44 or 45, 46.

Figure 8:
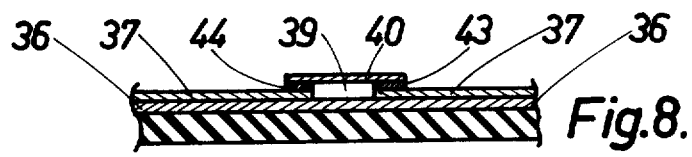
FIG. 8 is a cross-sectional view of a portion of FIG. 7 taken along lines 8—8 theeof.

FIG. 8 is a detail side elevation of the panel of FIG. 7 and shows the attachment of one of the connectors 40 by soldering at two spaced positions 43, 44 on opposite sides of the interruption 39 in the enamel strip 37. In a particular practical embodiment, the connector is arranged so that its maximum height above the surface of the support to which the coating 36 is applied is 1mm.

An appropriately shaped panel of the type shown in FIGS. 7 and 8 is especially suitable for use as an electrically heatable vehicle windscreen.

While the invention has been herein disclosed and described in what is presently conceived to be the most practical and preferred embodiments, it will be obvious to one of ordinary skill in the art that many modifications may be made thereof within the scope of the invention, which scope is not to be limited except by the appended claims.

What is claimed is:

1. An electrical resistance heating panel comprising a first electrical conductor formed by an electrically conductive coating or coatings on a support, a second electrical conductor of higher resistance than the first conductor and in circuit with the first conductor, wherein the improvement comprises
    a discontinuity formed in said first conductor which exposes an underlying non-solderable surface area of the support, and
    an electrically conductive bridge plate in electrically conductive arrangement with said first conductor, being soldered to said first conductor in facing relationship to the support at two distinct spaced positions along said plate, said positions being on opposite sides of said discontinuity, and every portion of said conductive bridge plate being spaced from the support.

2. An electrical circuit panel comprising
    an electrical conductor formed by an electrically conductive coating or coatings on a support,
    said conductor having a discontinuity formed therein which exposes an underlying non-solderable surface area of said support,
    an electrically conductive bridge plate in electrically conductive engagement with said conductive coating, said bridge plate being soldered to said conductor in facing relationship to said support at two distinct spaced positions along said plate, said positions being on opposite sides of said discontinuity, and
    a bridge plate portion between said two positions, and a lead wire in electrically conductive engagement with said portion.

3. An electrical circuit panel as recited in claim 2 wherein said electrically conductive bridge plate includes a laterally extending tongue portion extending between said two positions.

4. An electrical circuit panel as recited in claim 3 wherein said plate is substantially flat between said two positions.

5. An electrical circuit panel as recited in claim 3 wherein said plate is arched between said two positions, portions of said plate above said discontinuity being spaced from said support a greater distance than the portions of said plate at said two distinct spaced positions at which said plate is connected to said conductor.

6. An electrical circuit panel as recited in claim 2 wherein said plate is substantially flat between said two positions.

7. An electrical panel as recited in claim 2, wherein said plate is arched between said two positions, portions of said plate above said discontinuity being spaced from said support a greater distance than the portions of said plate at said two distinct spaced positions at which said plate is connected to said conductor.

8. An electrical circuit panel as recited in claim 2 wherein said conductor comprises a strip which is interrupted along its length by said discontinuity, said discontinuity extending the entire width of said strip.

9. An electrical circuit panel as recited in claim 2 wherein said discontinuity is at least 6mm long measured in the direction between said two positions.

10. An electrical circuit panel as recited in claim 9 wherein said electrically conductive bridge plate is arched between said two positions, portions of said plate above said discontinuity being spaced from said support a greater distance than the portions of said plate at said two distinct spaced positions at which said plate is connected to said conductor.

11. An electrical circuit panel as recited in claim 10 wherein the maximum height of said plate above said support in less than 3mm.

12. An electrical circuit panel as recited in claim 9 wherein said conductor comprises a strip which is interrupted along its length by said discontinuity.

13. An electrical circuit panel as recited in claim 9 wherein the maximum height of said plate above said support is less than 3mm.

14. An electrical circuit panel as recited in claim 2 wherein the maximum height of said plate above said support is less than 3mm.

* * * * *